(12) United States Patent
Yang et al.

(10) Patent No.: US 7,357,362 B2
(45) Date of Patent: Apr. 15, 2008

(54) BRACKET POSITIONING STRUCTURE FOR A SLIDE

(75) Inventors: Shun-Ho Yang, Kaohsiung Hsien (TW); Shih-Long Hwang, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 329 days.

(21) Appl. No.: 10/988,576

(22) Filed: Nov. 16, 2004

(65) Prior Publication Data

US 2005/0156493 A1    Jul. 21, 2005

(30) Foreign Application Priority Data

Dec. 30, 2003    (TW)    .............................. 92223019 U (51) Int. Cl.
*A47B 96/00* (2006.01)
*A47K 1/00* (2006.01)
*A47K 5/00* (2006.01)
*E04G 5/06* (2006.01)
*F16L 3/08* (2006.01)
*F21V 3/08* (2006.01)
*F21V 35/00* (2006.01)

(52) U.S. Cl. .................. 248/221.11; 248/243; 248/244; 248/245; 248/246; 248/220.22; 248/220.31; 248/222.52; 248/224.8; 312/334.4

(58) Field of Classification Search .......... 248/220.21, 248/220.22, 220.31, 221.11, 222.52, 224.8, 248/243–246; 211/26, 191, 192; 312/334.4, 312/334.5, 265.1, 265.2, 265.3, 265.4, 223.1
See application file for complete search history.

(56) References Cited

U.S. PATENT DOCUMENTS

| 3,055,462 | A | * | 9/1962 | Steele ......................... 403/18 |
| 4,872,734 | A | * | 10/1989 | Rechberg ..................... 312/333 |
| 5,580,138 | A | * | 12/1996 | Grabher ................... 312/319.1 |
| 6,120,206 | A | * | 9/2000 | Benner et al. .............. 403/231 |
| 6,367,899 | B1 | * | 4/2002 | Hwang et al. ......... 312/334.47 |
| 6,422,399 | B1 | | 7/2002 | Castillo et al. |
| 6,554,142 | B2 | | 4/2003 | Gray |
| 6,578,939 | B1 | * | 6/2003 | Mayer ...................... 312/334.5 |
| 6,585,337 | B1 | * | 7/2003 | Chen et al. ............ 312/334.46 |
| 6,595,379 | B1 | * | 7/2003 | Powell ....................... 211/192 |
| 6,659,577 | B2 | | 12/2003 | Lauchner |
| 6,666,340 | B2 | * | 12/2003 | Basinger et al. .............. 211/26 |
| 6,702,124 | B2 | * | 3/2004 | Lauchner et al. ............. 211/26 |

(Continued)

FOREIGN PATENT DOCUMENTS

JP    2000102427 A    4/2000

*Primary Examiner*—Brian E. Glessner
*Assistant Examiner*—Michael McDuffie
(74) *Attorney, Agent, or Firm*—Rosenberg, Klein & Lee (57) ABSTRACT

A bracket positioning structure for a slide includes a bracket having an end plate at one end and a fastening seat close to the end plate. The fastening seat is pivotally connected with a connecting element. The connecting element comprises an arm having at least one tooth and an end piece urged by an elastic element to swing to an angle and to return to its original position. When studs on the end plate of the bracket are inserted into holes of a support, the arm of the connecting element swings to one side with the tooth sliding along the edge of the support. The tooth hooks the support and is secured thereat.

5 Claims, 10 Drawing Sheets

U.S. PATENT DOCUMENTS

| | | | |
|---|---|---|---|
| 6,749,275 B2 * | 6/2004 | Cutler et al. | 312/334.4 |
| 6,773,080 B2 * | 8/2004 | Chen et al. | 312/265.1 |
| 6,811,129 B2 * | 11/2004 | Kimura | 248/221.11 |
| 6,935,521 B2 * | 8/2005 | Gundlach et al. | 211/183 |
| 6,948,691 B2 * | 9/2005 | Brock et al. | 248/222.13 |
| 2001/0040203 A1 | 11/2001 | Brock et al. | |
| 2003/0106863 A1 | 6/2003 | Lauchner et al. | |
| 2003/0107309 A1 | 6/2003 | Lauchner | |
| 2003/0111436 A1 | 6/2003 | Basinger et al. | |

* cited by examiner

BRACKET POSITIONING STRUCTURE FOR A SLIDE

BACKGROUND OF THE INVENTION

1. Field of the Invention

This invention relates to a bracket positioning structure for a slide, and more particularly to a bracket engaged with a support in a quick manner.

2. Description of the Related Art Neither Nor

A conventional sliding bracket incorporated with a metal support is applied to a cabinet for accommodating a computer server, such as U.S. Pat. Nos. 6,422,399 6,554,142, and 6,659,577. These designs are designed for different purposes with different structures. Such as the U.S. Pat. No. 6,659,577 uses a pair of long and short end plates, which cannot be used to a frame-shaped support of the U.S. Pat. No. 6,422,399 nor a reverse U-shaped support of the U.S. Pat. No. 6,659,577. The hooks of the U.S. Pat. No. 6,422,399 cannot be applied to the round holes of a support.

SUMMARY OF THE INVENTION

It is the primary objective of the present invention to provide a bracket positioning structure for a slide, which can be engaged with a support in a quick manner.

It is another objective of the present invention to provide the bracket positioning structure for a slide, which is easy to operate.

It is a further objective of the present invention to provide the bracket positioning structure for a slide, which is compact in size.

BRIEF DESCRIPTION OF THE BRIEF DESCRIPTION

DETAILED DESCRIPTION OF THE PREFERRED EMBODIMENTS

Figure 1:
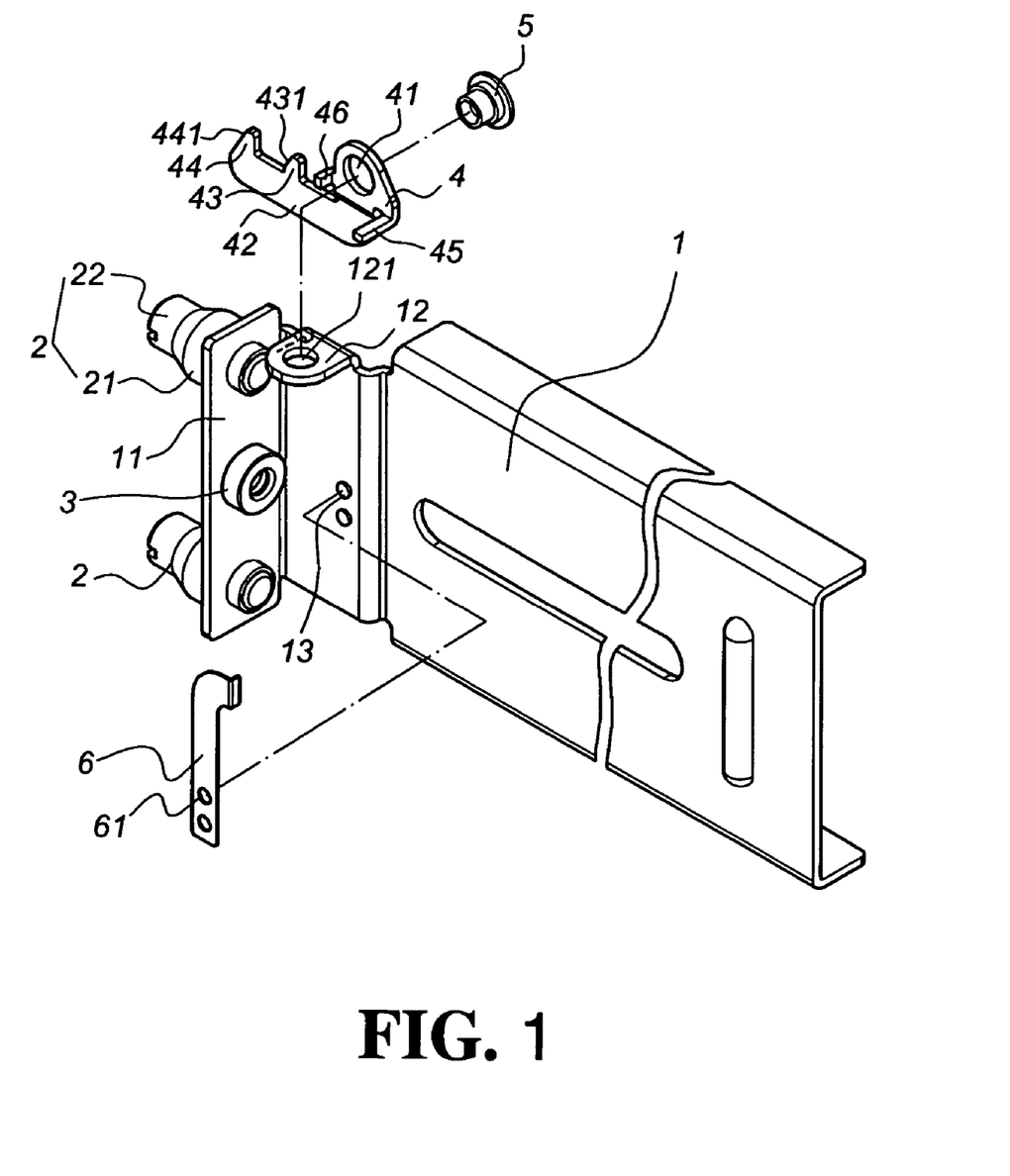
FIG. 1 is an exploded view of a first embodiment of the present invention.
Figure 2:
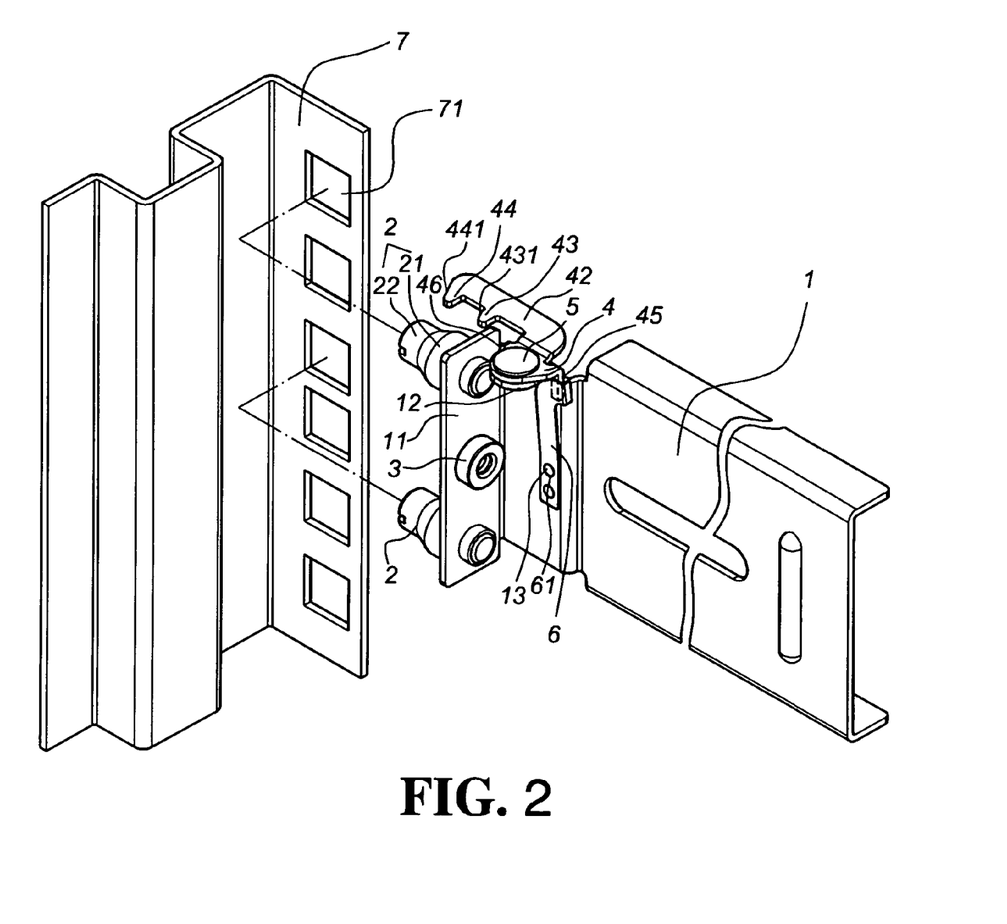
FIG. 2 is a perspective view of the first embodiment of the present invention with a support.
Figure 3:
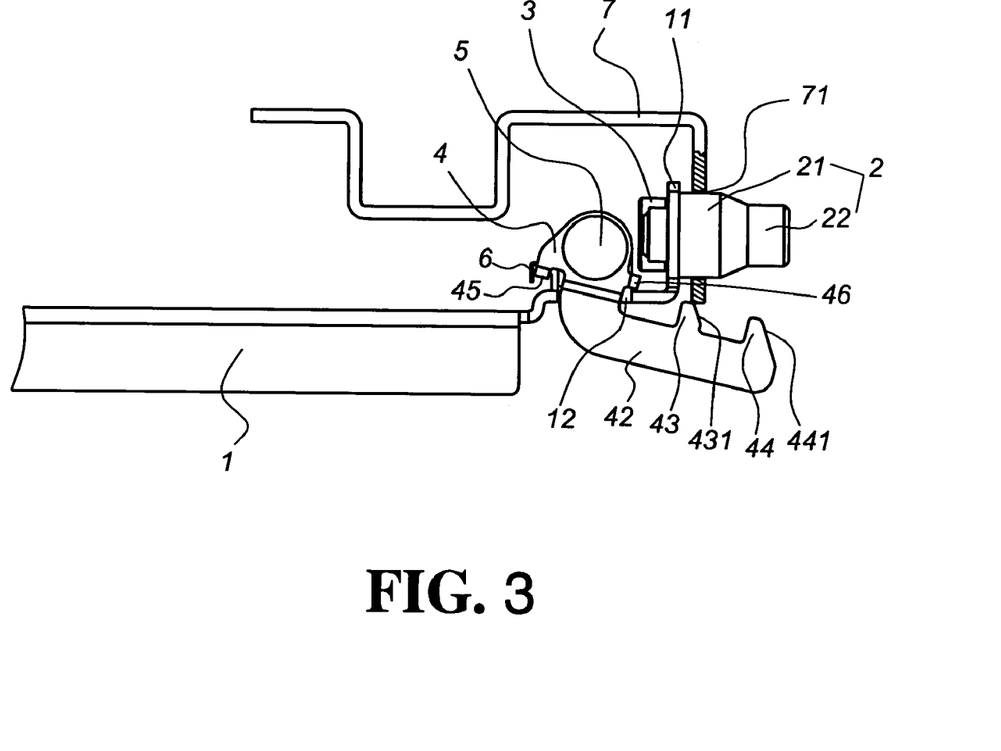
FIG. 3 is a top view of the first embodiment of the present invention incorporated with the support.
Figure 4:
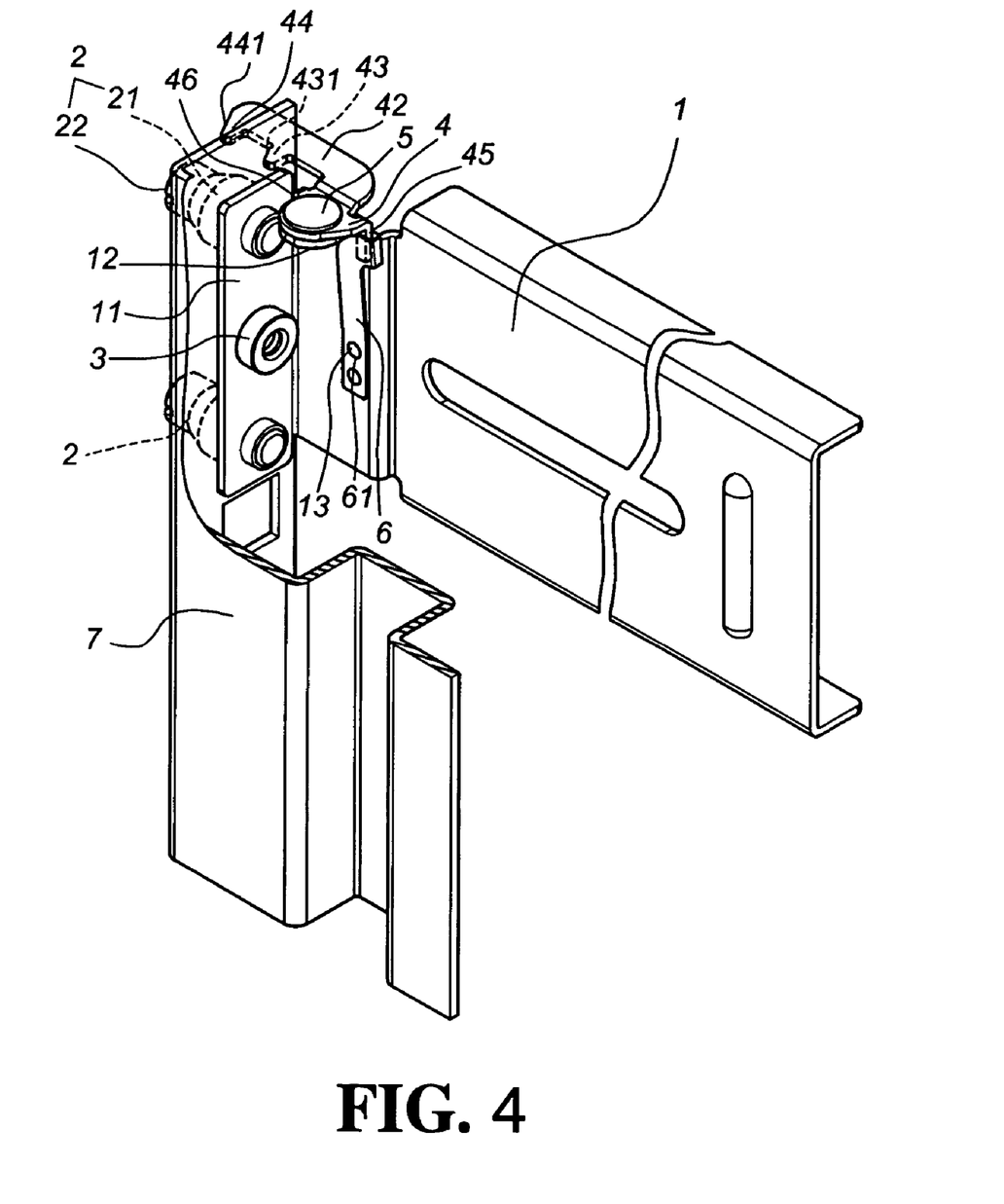
FIG. 4 is a first assembly view of the first embodiment of the present invention.
Figure 5:
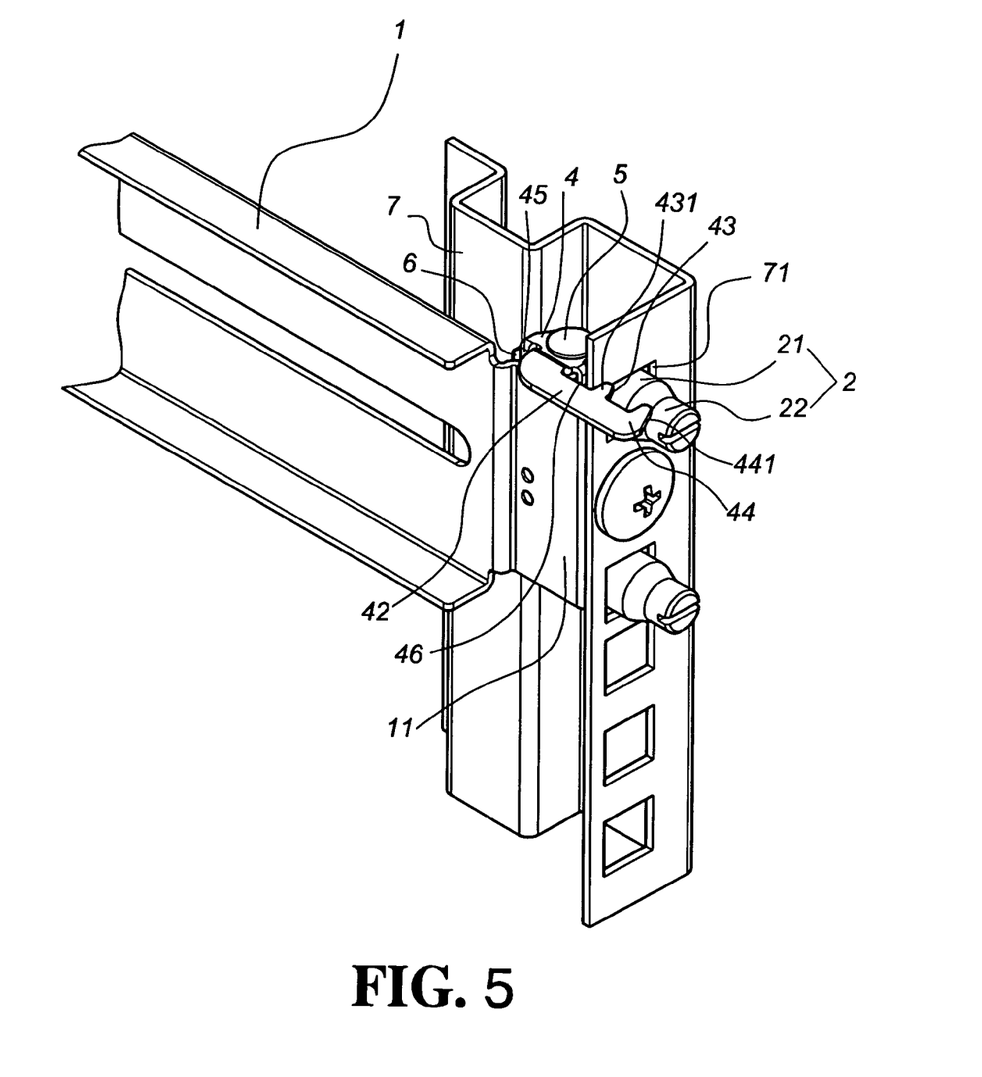
FIG. 5 is a view of FIG. 4 in a different angle.

As shown in FIGS. 1 and 2, a first embodiment of the present invention comprises a bracket 1 having an end plate 11. The end plate 11 has a pair of studs 2 protruding outwardly. Each stud 2 has a neck 21 and a reduced section 22 thereon to be inserted into a square hole 71 of a support 7 or a round hole 81 of a support 8 (please refer to FIG. 7). A nut 3 between the two studs 2 is provided at the inner center of the end plate 11.

The bracket 1 is formed with a fastening seat 12 having a hole 121 close to the end plate 11. The fastening seat 12 is pivotally connected with a connecting element 4 by means of a fastener 5. The connecting element 4 has a hole 41 and an arm 42 facing the studs 2. The arm 42 is formed with at least a tooth 43 at one side, corresponding to the holes 71, 81 of the support 7 or 8. In the accompanying drawings, the arm 42 has two teeth 43 and 44 thereon. The tooth 43 has a bevel edge 431 at the front end. The tooth 44 comprises a bevel edge 441 at the front end. The connecting element 4 is provided with an end piece 45 urged by an elastic element 6 to swing to an angle and to return to its original position. The elastic element 6 has holes 61 to be secured to protuberances 13 on the bracket 1. One end of the elastic element 6 is engaged with the end piece 45 of the connecting element 4. The connecting element 4 further comprises a block 46 to be engaged with the edge of the fastening seat 12 of the bracket 1 to confine the rotating angle of the connecting element 4.

As shown in FIGS. 2~5, the necks 21 of the studs 2 of the end plate 11 of the bracket 1 are fully inserted into the holes 71 of the support 7. The bevel edge 431 of the tooth 43 of the connecting element 4 slides along the edge of the support 7, causing the arm 42 to swing. The elastic element 6 forces the connecting element 4 to return to its original position. The tooth 43 hooks the support 7 and is secured thereat.

Figure 6:
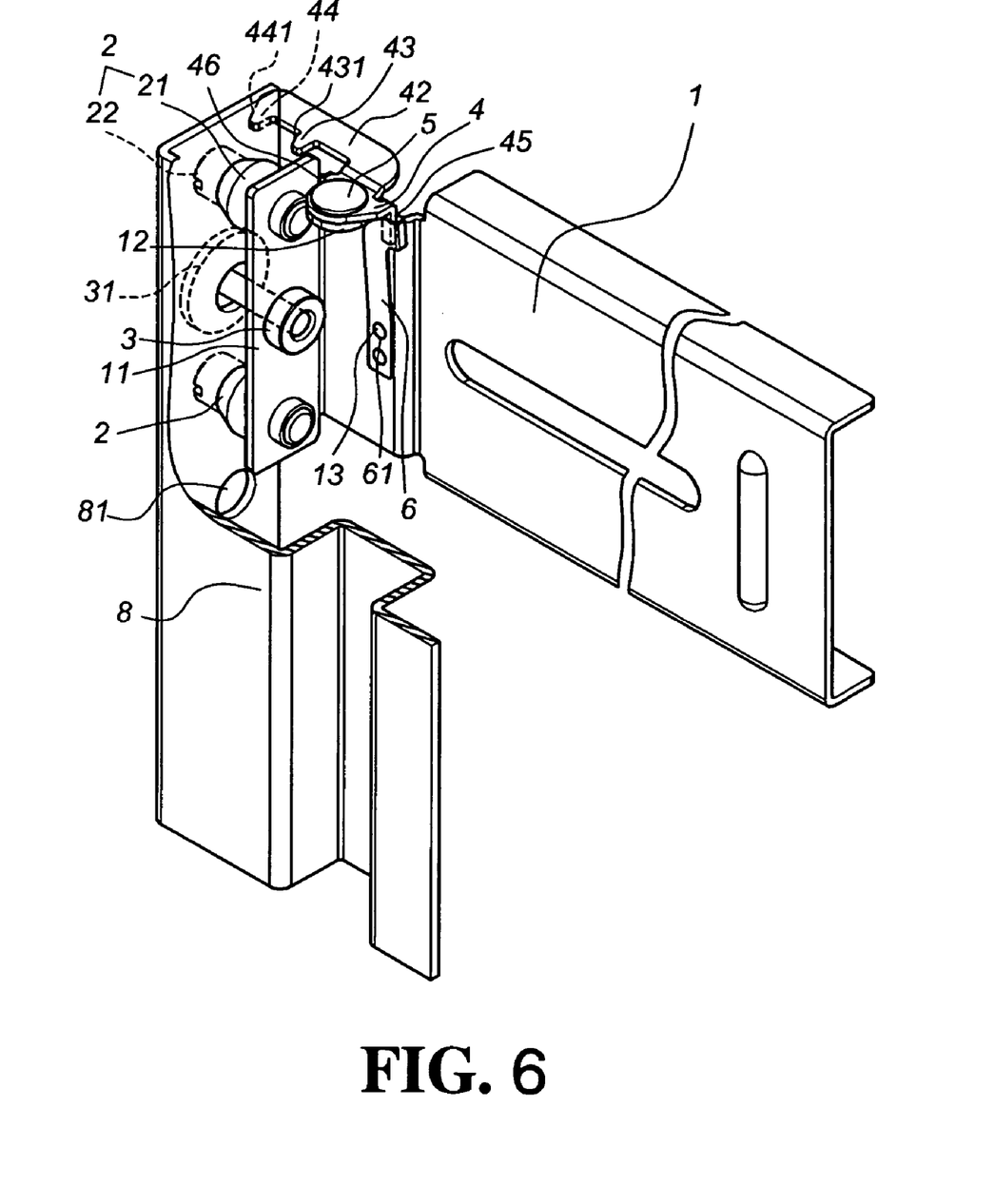
FIG. 6 is a first assembly view of the first embodiment of the present invention incorporated with another support.
Figure 7:
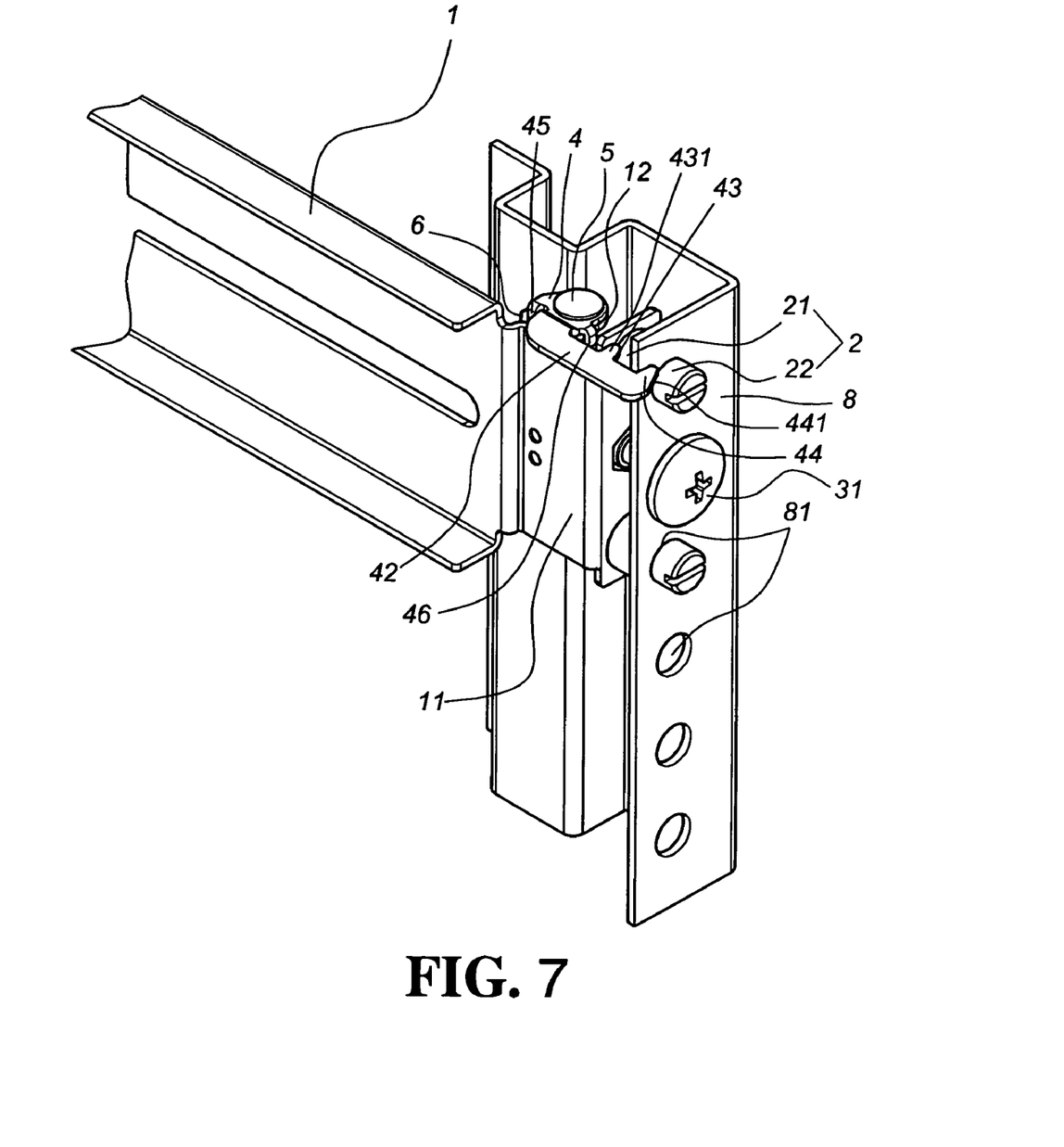
FIG. 7 is a view of FIG. 6 in a different angle.

As shown in FIGS. 6 and 7, the reduced sections 22 of the studs 2 are inserted into the holes 81 of the support 8. The tooth 44 of the arm 42 hooks the support 8 and is secured thereat. A bolt 31 is adapted to insert through a desired hole 81 of the support 8 and secured to the nut 3 on the bracket 1.

Figure 8:
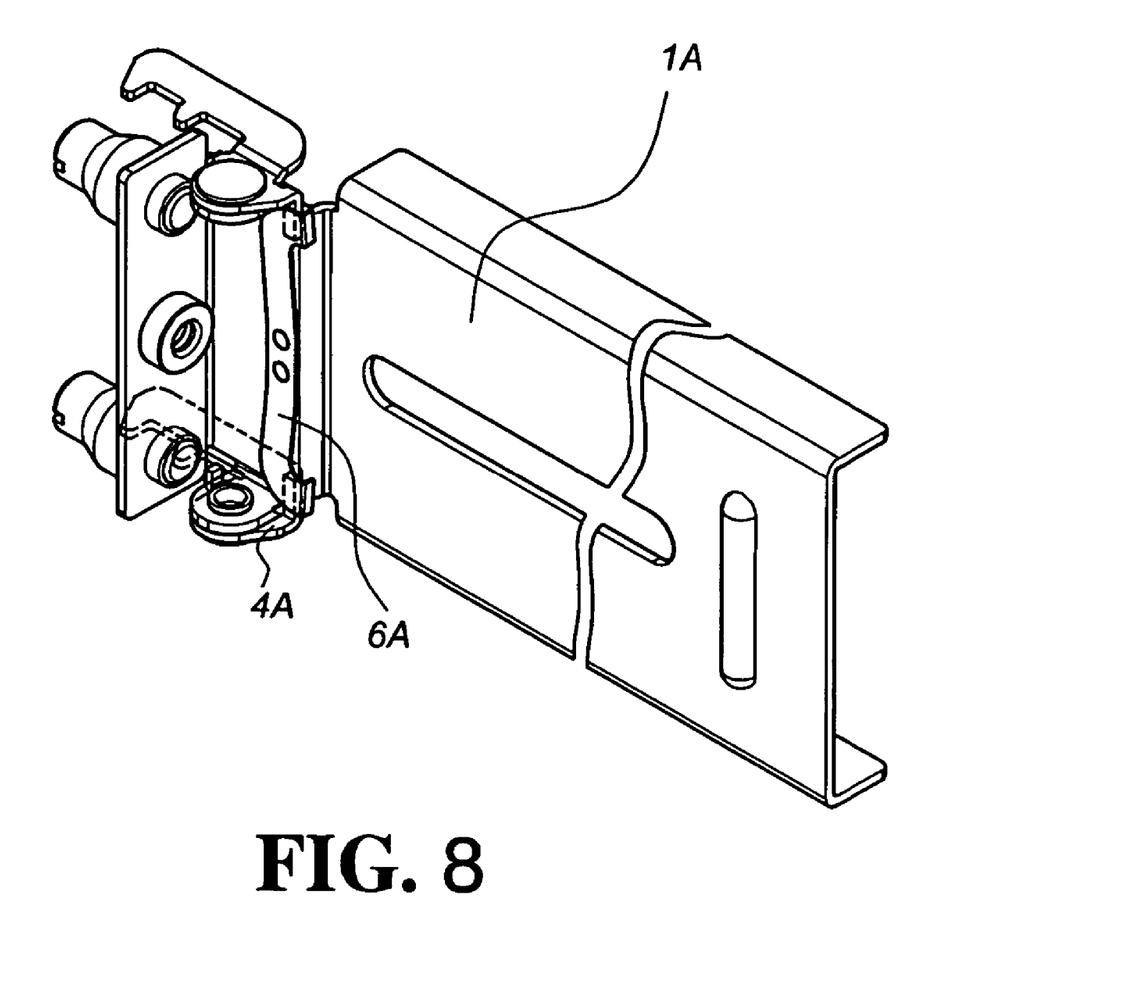
FIG. 8 is a perspective view of a second embodiment of the present invention.

FIG. 8 shows a second embodiment of the present invention. A connecting element 4A is provided at the lower end of a bracket 1A. The connecting element 4A is urged by an elastic element 6A to return to its original position after swing. This design is a double-engagement bracket. This design can be a single-engagement bracket as well by securing the connecting element 4A underneath the bracket 1A.

Figure 9:
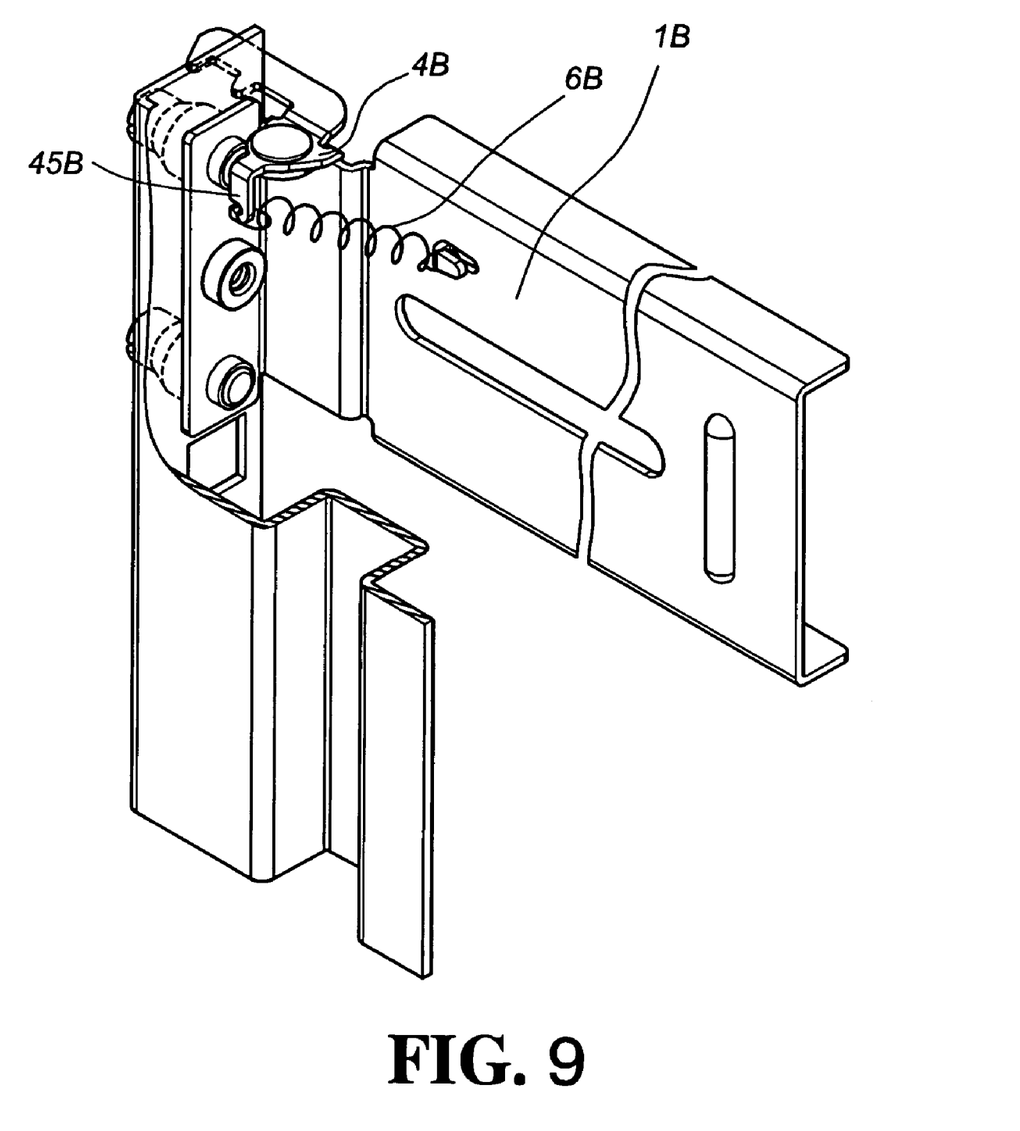
FIG. 9 is a perspective view of a third embodiment of the present invention.

FIG. 9 shows a third embodiment of the present invention. A connecting element 4B is urged by an elastic element 6B to return to its original position after swing. The elastic element 6B is a spring having one end secured to a bracket 1B and another end secured to an end piece 45B of the connecting element 4B.

Figure 10:
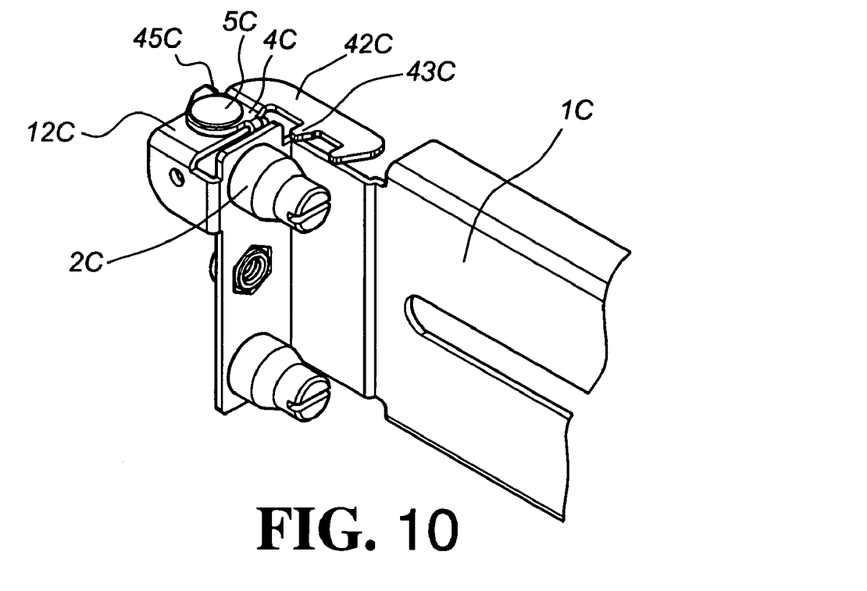
FIG. 10 is a perspective view of a fourth embodiment of the present invention.
Figure 11:
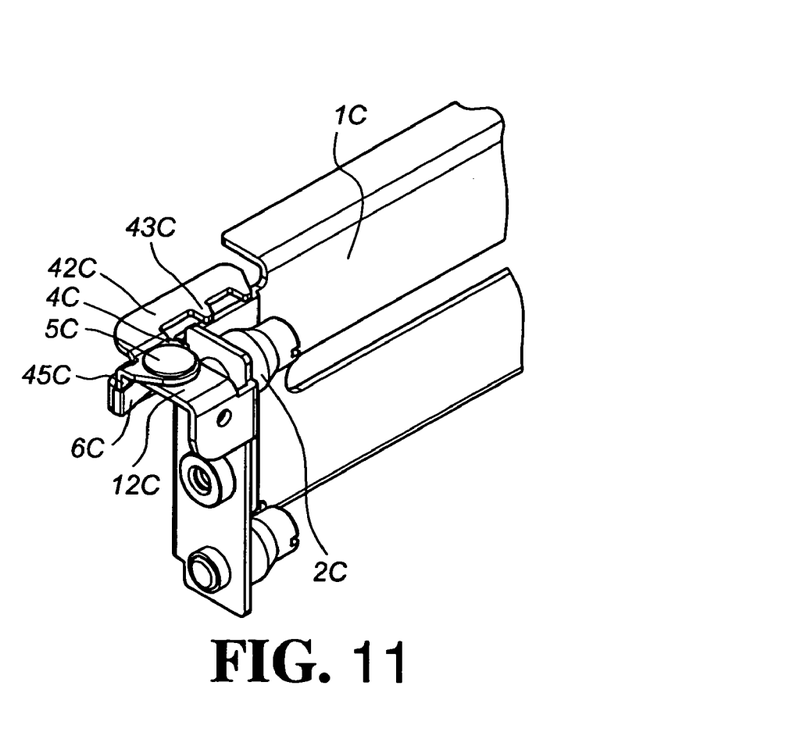
FIG. 11 is a view of FIG. 10 in a different angle.

FIGS. 10 and 11 show a fourth embodiment of the present invention. Studs 2C and a connecting element 4C on a bracket 1C are designed in an opposite direction. A fastening seat 12C extends from the front end of the bracket 1C for a fastener 5C to insert therein and to secure the connecting element 4C at place. The connecting element 4C has an arm 42C facing the studs 2C. The arm 42C has at least a tooth 43C thereon.

What is claimed is:

1. A bracket positioning structure for a slide comprising: studs disposed on an end plate of a bracket to be inserted into holes of a support, said bracket including:
   a fastening seat close to said end plate, said fastening seat being pivotally connected with a connecting element, said connecting element including:
   an arm having at least one tooth at one side; and
   an end piece urged by an elastic element to return said connecting element to its original position, said elastic element being formed with an elastic piece having one end secured to said bracket and another end engaged with said end piece of said connecting element, wherein when said studs of said bracket are inserted into said holes of said support, said tooth of said connecting element slides along a peripheral edge of said support, said elastic element urges said tooth of said connecting element to engage with the peripheral edge of said support thereby retaining said studs in said holes of said support.

2. The bracket positioning structure for a slide, as recited in claim 1, wherein said arm of said connecting element is formed in a direction facing said studs.

3. The bracket positioning structure for a slide, as recited in claim 1, wherein said tooth of said arm of said connecting element has a bevel edge at the front end.

4. The bracket positioning structure for a slide, as recited in claim 1, wherein said elastic piece is a spring having one end secured to said bracket and another end connected with said end piece of said connecting element.

5. The bracket positioning structure for a slide, as recited in claim 1, wherein said connecting element further comprises a block to engage with said fastening seat of said bracket.

* * * * *